United States Patent [19]
Han et al.

[11] Patent Number: 5,535,152
[45] Date of Patent: Jul. 9, 1996

[54] SEMICONDUCTOR CHIP HAVING A LOW-NOISE POWER SUPPLY ARRANGEMENT

[75] Inventors: Yong-Joo Han, Seoul; Myung-Ho Bae, Kyungki-do, both of Rep. of Korea

[73] Assignee: Samsung Electronics Co., Ltd., Suwon, Rep. of Korea

[21] Appl. No.: 291,943

[22] Filed: Aug. 17, 1994

[30] Foreign Application Priority Data

Sep. 6, 1993 [KR] Rep. of Korea .................. 1993-17783

[51] Int. Cl.$^6$ ................................................. H01L 27/10
[52] U.S. Cl. ............................. 365/51; 365/63; 365/226
[58] Field of Search ............................. 365/51, 63, 226; 257/207, 208

[56] References Cited

U.S. PATENT DOCUMENTS

| | | | |
|---|---|---|---|
| 4,855,613 | 8/1989 | Yamada et al. .......................... | 365/63 |
| 5,007,025 | 4/1991 | Hwang et al. .......................... | 365/51 |
| 5,293,334 | 3/1994 | Shimizu .................................. | 365/51 |

*Primary Examiner*—David C. Nelms
*Assistant Examiner*—Vu A. Le
*Attorney, Agent, or Firm*—Cushman Darby & Cushman

[57] ABSTRACT

A power supply arrangement for a semiconductor chip includes, in a first preferred embodiment, a power supply voltage line, a ground voltage line, an intermediate voltage line, a plurality of first noise reduction capacitors connected between the intermediate voltage line and the power supply voltage line, and a plurality of second noise reduction capacitors connected between the intermediate voltage line and the ground voltage line. In a second preferred embodiment, the power supply arrangement includes a power supply voltage line, a ground voltage line, a quiet power supply voltage line, a quiet ground voltage line, a plurality of first noise reduction capacitors connected between the power supply voltage line and the quiet ground voltage line, and a plurality of second noise reduction capacitors connected between the ground voltage line and the quiet power supply voltage line.

19 Claims, 3 Drawing Sheets

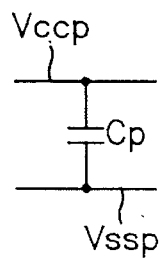
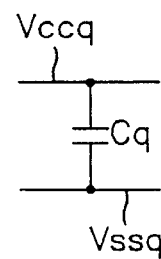
FIG. 1A (PRIOR ART)
FIG. 1B (PRIOR ART)
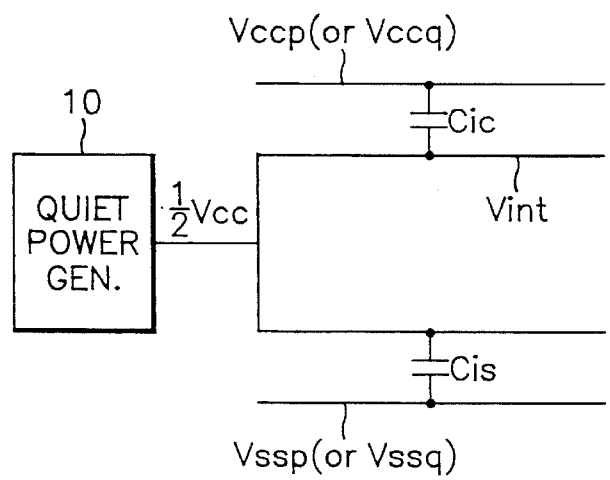
FIG. 2
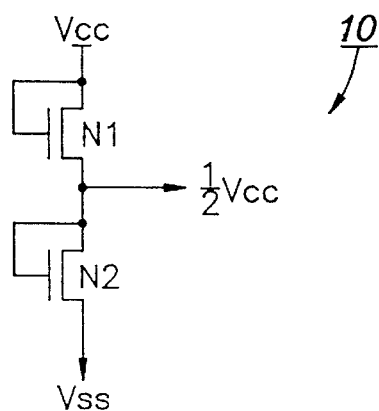
FIG. 3A

SEMICONDUCTOR CHIP HAVING A LOW-NOISE POWER SUPPLY ARRANGEMENT

BACKGROUND OF THE INVENTION

The present invention relates generally to semiconductor chips, and, more particularly, to a semiconductor chip having a low-noise power supply arrangement.

In general, semiconductor chips are typically supplied with a power supply voltage (e.g., Vcc) and a reference (e.g., ground or Vss) voltage over separate lines, and typically incorporate an internal power supply generator coupled between the separate power supply voltage and reference voltage lines for generating an intermediate voltage having a level between that of the power supply and reference voltages (e.g., ½ Vcc).

Semiconductor memory devices, such as dynamic random access memories (DRAMs), include a memory array region and a peripheral circuit region formed on a single semiconductor chip. Inevitably, the intrinsic coupling capacitance between the power supply voltage and reference voltage lines thereof results in the transfer of unwanted noise from the reference voltage line to the power supply voltage line. This unwanted noise can seriously interfere with the normal operation of the memory device, and, in particular, can cause erroneous read/write of data from/into the memory array. This noise transfer problem has become more acute as the length of the power supply and reference voltage lines has increased, in parallel with increases in the integration density and storage capacity of semiconductor memory devices.

At present, the prevalent technique for reducing noise transfer between the power supply voltage and reference voltage lines is to provide a noise reduction capacitor coupled between the power supply voltage and reference voltage lines. FIGS. 1A and 1B are equivalent circuit diagrams which illustrate the use of a noise reduction capacitor in a peripheral circuit and a data output circuit of a semiconductor memory device, respectively. As can be seen in FIG. 1A, a noise reduction capacitor Cp is connected between a peripheral circuit power supply voltage line Vccp and a peripheral circuit ground voltage line Vssp. Similarly, as can be seen in FIG. 1B, a noise reduction capacitor Cq is connected between a data output circuit power supply voltage line Vccq and a data output circuit ground voltage line Vssq. In practice, such noise reduction capacitors Cp and Cq have only proven to be partially effective. More particularly, although such noise reduction capacitors Cp and Cq have reduced the noise transfer between the power supply voltage and ground voltage lines, there still exists a serious problem of noise transfer due to the below-described noise coupling phenomenon, More particularly, when low logic level data is read from the memory array immediately after high logic level data has been read from the memory array, the data output line, which is driven by the data output buffer, is abruptly driven from a high voltage level to ground level, thereby causing a current spike to be generated on the ground voltage line Vssq (due to the rapid voltage swing). This current spike is then transferred to the power supply voltage line of the data output circuit via the coupling capacitor Cq, thereby introducing unwanted noise, which can result in a data output error. A similar problem exists with respect to the peripheral circuits of the semiconductor memory device, e.g., with respect to the sense amplifiers and associated bit lines of the memory device. Moreover, a noise component in the power supply voltage can be transferred from the power supply voltage line to the ground voltage line via the coupling capacitor Cq (or Cp).

Based on the above, it can be appreciated that there presently exists a need in the art for a power supply arrangement for a semiconductor chip which eliminates the above-described drawbacks and shortcomings of the presently available semiconductor chips.

SUMMARY OF THE INVENTION

The present invention encompasses a power supply arrangement for a semiconductor chip which includes, in a first preferred embodiment, a power supply voltage line, a ground voltage line, an intermediate voltage line, a plurality of first noise reduction capacitors connected between the intermediate voltage line and the power supply voltage line, and a plurality of second noise reduction capacitors connected between the intermediate voltage line and the ground voltage line.

In a second preferred embodiment, the power supply arrangement of the present invention includes a power supply voltage line, a ground voltage line, a quiet power supply voltage line, a quiet ground voltage line, a plurality of first noise reduction capacitors connected between the power supply voltage line and the quiet ground voltage line, and a plurality of second noise reduction capacitors connected between the ground voltage line and the quiet power supply voltage line.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIG. 1A is an equivalent circuit diagram of a conventional power supply arrangement for a peripheral circuit of a semiconductor memory device;

FIG. 1B is an equivalent circuit diagram of a conventional power supply arrangement for a data output circuit of a semiconductor memory device;

FIG. 2 is a schematic diagram of a power supply arrangement according to a first preferred embodiment of the present invention;

FIG. 3A is a schematic diagram depicting a preferred embodiment of the quiet power generator shown in FIG. 2;

DETAILED DESCRIPTION OF THE INVENTION

With reference now to FIG. 2A, there can be seen a first preferred embodiment of the power supply arrangement of the present invention. More particularly, there can be seen a quiet power generator 10 which generates an intermediate voltage Vint whose level (e.g., ½ Vcc) is between that of a power supply voltage, Vccp, for a peripheral circuit (or, Vccq, for a data output circuit), and that of a reference voltage, Vssp, for a peripheral circuit (or, Vssq, for a data output circuit).

The quiet power generator 10 is preferably an intermediate voltage generator of a design which produces a stable, relatively noise-free (quiet) intermediate voltage Vint. The quiet power generator 10 is an internal (on-chip) voltage generator which is coupled between the power supply voltage Vccp (or Vccq) and the reference (e.g., ground) voltage Vssp (or Vssq). A preferred embodiment of the quiet power generator 10, as depicted in FIG. 3A, is comprised of diode-connected NMOS transistors N1 and N2 (preferably having the same dimensions) connected in series between the power supply voltage Vcc and the ground voltage Vss, with the output, which constitutes the intermediate or quiet voltage Vint, being taken from the node intermediate the transistors N1 and N2, and applied to a quiet voltage line Vint, With reference now to FIG. 2 again, in accordance with the first preferred embodiment of the present invention, a first noise reduction capacitor Cic is coupled between the power supply voltage line, Vccp (or Vccq), and the quiet voltage line Vint, and a second noise reduction capacitor Cis is coupled between the ground voltage line, Vssp (or Vssq), and the quiet voltage line Vint. With this power supply arrangement of the first preferred embodiment of the present invention, noise which would otherwise be transferred between the power supply voltage and ground voltage lines is absorbed by the respective noise reduction capacitors Cic and Cis.

Figure 3B:
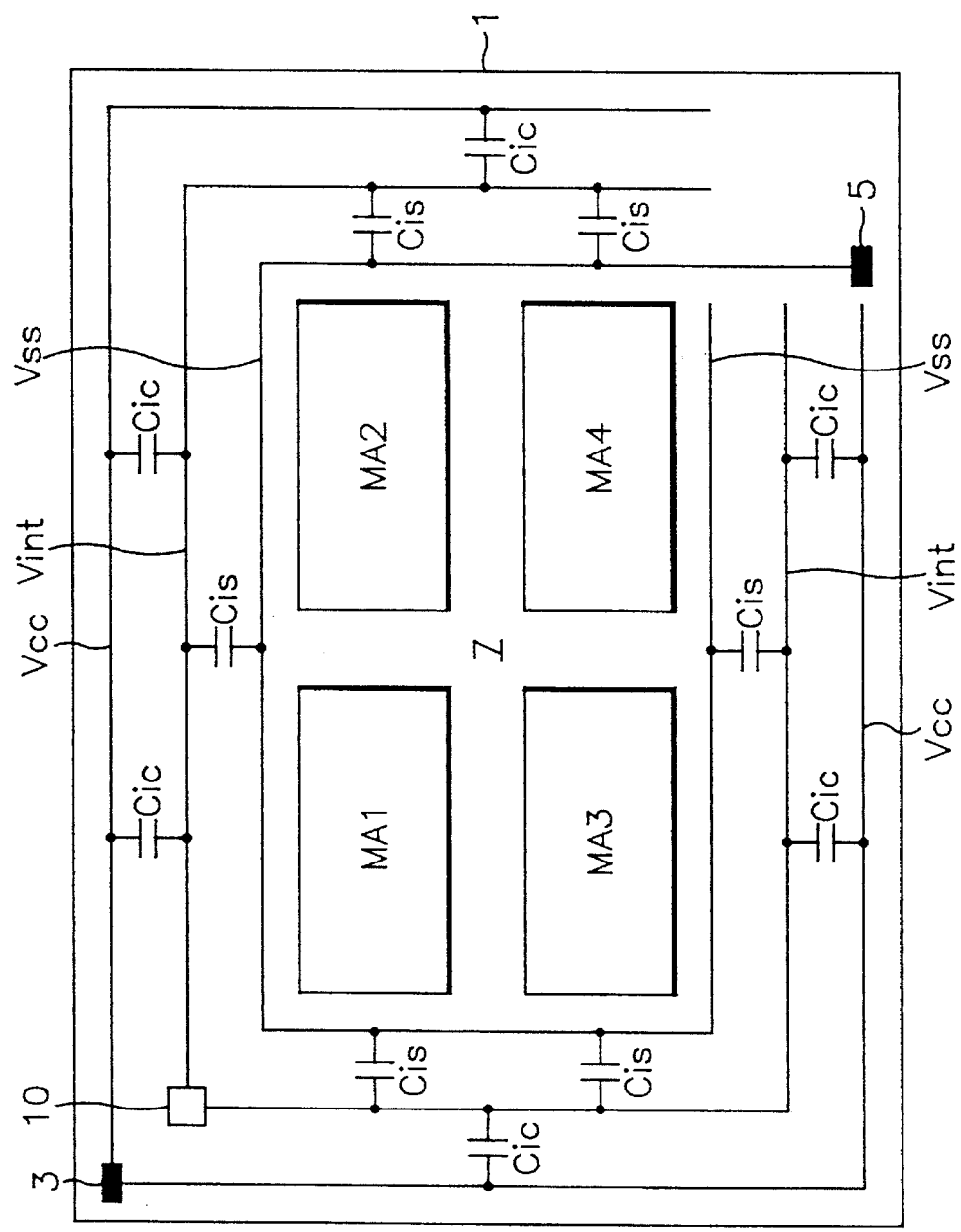
FIG. 3B is a partial schematic, partial block diagram depicting a semiconductor memory device incorporating the power supply arrangement shown in FIG. 2.

With reference now to FIG. 3B, there can be seen a semiconductor memory chip 1 in which the power supply arrangement of the above-described first preferred embodiment of the present invention is utilized. As can be seen in FIG. 3B, the semiconductor memory chip 1 includes a memory array which is divided into memory banks or memory sub-arrays MA1–MA4, and remaining regions 7 on which the peripheral circuits, e.g. address buffers and decoders, sense amplifiers, data I/O lines, data output buffers, and the like, are located. However, it should be clearly understood that neither the type nor the architecture of the semiconductor chip in which the present invention is utilized is limiting to the broader aspects of the present invention.

With continuing reference to FIG. 3B, the semiconductor memory chip 1 further includes a power supply voltage line Vcc extending from a power supply voltage pad 3, and a ground voltage line Vss extending from a ground voltage pad 5. A plurality of noise reduction capacitors Cic are coupled between the quiet voltage line Vint and the power supply voltage line Vcc, and a plurality of noise reduction capacitors Cis are coupled between the quiet voltage line Vint and the ground voltage line Vss.

Preferably, each of the noise reduction capacitors Cic and Cis are comprised of an NMOS transistor whose gate electrode is connected to the power supply line Vcc and ground voltage line Vss, respectively, by means of a conductive polysilicon, polycide, or metal line, and whose source and drain electrodes are connected in common to the quiet voltage line Vint by means of the same conductive material.

It should be appreciated that although the power supply voltage line Vcc is shown in FIG. 3B to extend from a single power supply voltage pad 3, and the ground voltage line Vss is shown in FIG. 3B to extend from a single ground voltage pad 5, the power supply arrangement of the present invention can also be utilized in a semiconductor memory chip in which the memory circuits and the peripheral and data output circuits are connected to separate power supply voltage and ground voltage lines extending from respective separate power supply voltage pads and ground voltage pads.

Figure 4A:
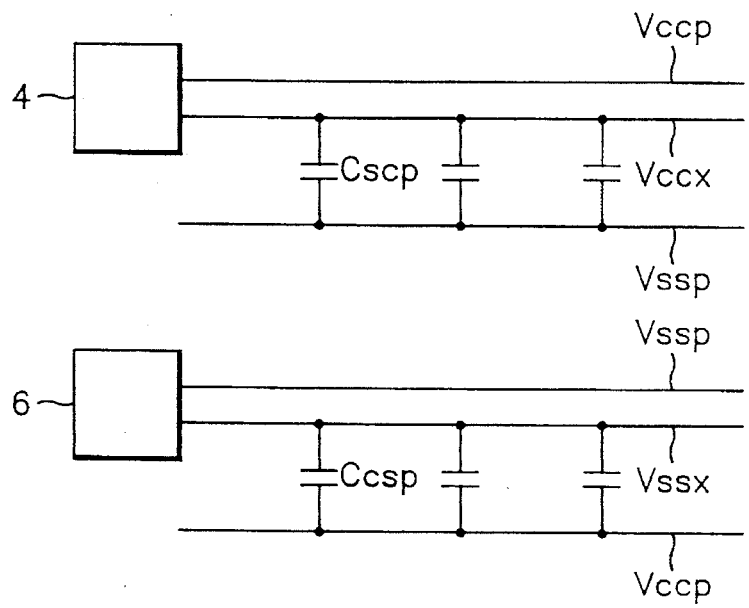
FIG. 4A is a schematic diagram of a power supply arrangement according to a second preferred embodiment of the present invention; and, FIG. 4B is a partial schematic, partial block diagram depicting a Semiconductor memory device incorporating the power supply arrangement shown in FIG. 4A.

With reference now to FIG. 4A, there can be seen a second preferred embodiment of the power supply arrangement of the present invention. In this embodiment, which finds particular utility for the peripheral circuits of a semiconductor memory device, a power supply voltage line Vccp and a quiet power voltage line Vccx extend from a common power supply voltage pad 4, and a ground voltage line Vxxp and a quiet ground voltage line Vssx extend from a common ground voltage pad 6. Noise reduction capacitors Cscp are connected between the quiet power supply voltage line Vccx and the ground voltage line Vssp, and noise reduction capacitors Ccsp are connected between the quiet ground voltage line Vssx and the power supply voltage line Vccp. With this power supply arrangement of the second preferred embodiment of the present invention, noise which would otherwise be transferred from the ground voltage line Vssp to the power supply voltage line Vccp are absorbed into the quiet ground voltage line Vssx via the noise reduction capacitors Ccsp, and noise which would otherwise be transferred from the power supply voltage line Vccp to the ground voltage line Vssp are absorbed into the quiet power supply line Vccx via the noise reduction capacitors Cscp.

Figure 4B:
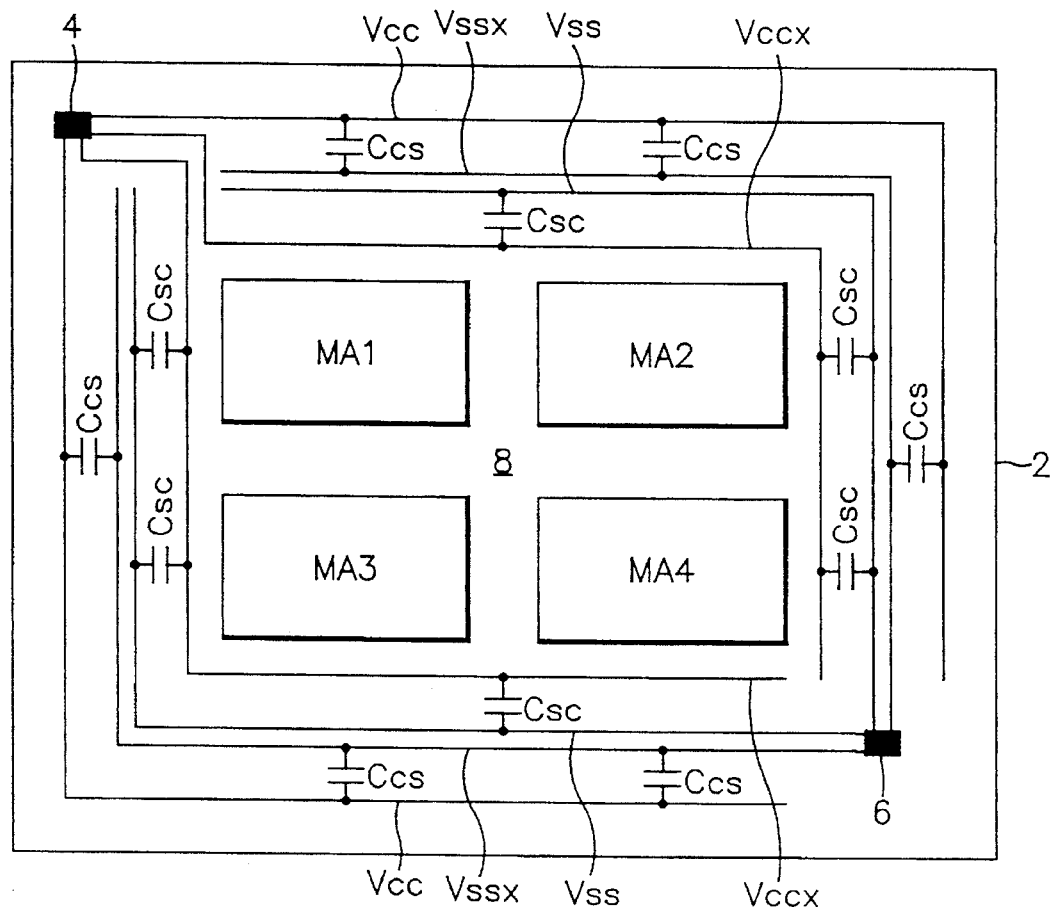

FIG. 4B depicts a semiconductor memory chip 2 in which the power supply arrangement of the above-described second preferred embodiment of the present invention is utilized. As can be seen in FIG. 4B, the semiconductor memory chip 2 includes a memory array which is divided into memory banks or sub-arrays MA1–MA4, and remaining regions 8 on which the peripheral circuits are located. However, it should be clearly understood that neither the type nor the architecture of the semiconductor chip in which the present invention is employed is limiting to the broader aspects of the present invention.

Preferably, each of the noise reduction capacitors Ccsp are comprised of an NMOS transistor whose gate electrode is connected to the power supply voltage line Vccp, and whose source and drain electrodes are connected in common to the quiet ground voltage line Vssx; and, each of the noise reduction capacitors Cscp are comprised of an NMOS transistor whose gate electrode is connected to the ground voltage line Vssp, and whose source and drain electrodes are connected in common to the quiet power supply voltage line Vccx.

Although various preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A power supply arrangement, comprising:

a first voltage line coupled to a first voltage;

a second voltage line coupled to a second voltage having a level less than that of said first voltage;

a third voltage line coupled to a third voltage having a level between that of said first and second voltages;

a first noise reduction device connected between said first voltage line and said third voltage line; and a third voltage generator for generating said third voltage, said third voltage generator being coupled between said first voltage and said second voltage, said third voltage generator producing a substantially stable and noise-free voltage level.

2. The power supply arrangement as set forth in claim 1, further comprising a second noise reduction device connected between said second voltage line and said third voltage line.

3. The power supply arrangement as set forth in claim 1, wherein said third voltage generator comprises an intermediate voltage generator, and said third voltage is one-half the level of said first voltage.

4. The power supply arrangement as set forth in claim 1, wherein said third voltage generator comprises at least two diode-connected NMOS transistors connected in series between said first voltage and said second voltage, and having an output node intermediate said at least two diode-connected NMOS transistors, said third voltage line being coupled to said output node.

5. The power supply arrangement as set forth in claim 4, wherein the power supply arrangement is incorporated in a semiconductor chip.

6. The power supply arrangement as set forth in claim 5, wherein said semiconductor chip comprises a semiconductor memory chip.

7. The power supply arrangement as set forth in claim 1, wherein said first noise reduction device comprises a capacitor.

8. The power supply arrangement as set forth in claim 2, wherein said first noise reduction device comprises a first capacitor and said second noise reduction device comprises a second capacitor.

9. The power supply arrangement as set forth in claim 8, wherein:

said first capacitor comprises a first NMOS transistor having a gate electrode connected to said first voltage line, and having source and drain electrodes connected in common to said third voltage line; and, said second capacitor comprises a second NMOS transistor having a gate electrode connected to said second voltage line, and having source and drain electrodes connected in common to said third voltage line.

10. A power supply arrangement, comprising:

a first voltage line coupled to a first voltage;

a second voltage line coupled to a second voltage having a level less than that of said first voltage;

a first quiet voltage line coupled to a third voltage having the same level as said first voltage;

a second quiet voltage line coupled to a fourth voltage having the same level as said second voltage;

a first noise reduction device connected between said first quiet voltage line and said second voltage line; and, a second noise reduction device connected between said second quiet voltage line and said first voltage line.

11. The power supply arrangement as set forth in claim 10, further comprising:

a first conductive pad;

a second conductive pad;

wherein said first voltage line and said first quiet voltage line are connected to and extend from said first conductive pad; and, wherein said second voltage line and said second quiet voltage line are connected to and extend from said second conductive pad.

12. The power supply arrangement as set forth in claim 10, wherein said first noise reduction device comprises a first capacitor and said second noise reduction device comprises a second capacitor.

13. The power supply arrangement as set forth in claim 12, wherein:

said first capacitor comprises a first NMOS transistor having a gate electrode connected to said first voltage line, and having source and drain electrodes connected in common to said second quiet voltage line; and, a second capacitor comprises a second NMOS transistor having a gate electrode connected to said second voltage line, and having source and drain electrodes connected in common to said first quiet voltage line.

14. The power supply arrangement as set forth in claim 10; wherein the power supply arrangement is incorporated in a semiconductor chip.

15. The power supply arrangement as set forth in claim 14, wherein said semiconductor chip comprises a semiconductor memory chip.

16. The power supply arrangement as set forth in claim 15, wherein said first voltage line comprises a power supply voltage line for a peripheral circuit of said semiconductor memory chip, and said second voltage line comprises a ground voltage line for a peripheral circuit of said semiconductor memory chip.

17. A semiconductor chip having a power supply voltage line and a ground voltage line, comprising:

a quiet power line disposed between said power supply voltage line and said ground voltage line, said quiet power line being coupled to a quiet voltage having a voltage level between that of said power supply voltage line and said ground voltage line; and, noise suppression means connected between said quiet power line and said power supply voltage line, and between said ground voltage line and said quiet power line, for minimizing the transfer of noise between said power supply voltage line and said ground voltage line.

18. The semiconductor chip as set forth in claim 17, wherein said noise suppression means comprises:

a plurality of first capacitors connected between said quiet power line and said power supply voltage line; and, a plurality of second capacitors connected between said quiet power line and said ground voltage line.

19. A semiconductor chip having a power supply voltage line and a ground voltage line, comprising:

a quiet power voltage line being connected to a power supply voltage having the same level as that of said power supply voltage line;

a quiet ground voltage line being connected to a ground voltage having the same level as that of said ground voltage line;

first noise suppression means coupled between said quiet power voltage line and said ground voltage line; and, second noise suppression means coupled between said quiet power voltage line and said power supply voltage line.

* * * * *